(12) United States Patent
Eggers et al.

(10) Patent No.: US 6,661,227 B2
(45) Date of Patent: Dec. 9, 2003

(54) MR METHOD AND MR DEVICE WITH MEANS FOR MAKING CORRECTIONS FOR CHANGES OF THE POSITION AND/OR ORIENTATION OF COILS

(75) Inventors: Holger Eggers, Kaltenkirchen (DE); Steffen Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/177,459

(22) Filed: Jun. 21, 2002

(65) Prior Publication Data
US 2003/0016015 A1 Jan. 23, 2003

(30) Foreign Application Priority Data
Jun. 21, 2002 (DE) .......................................... 101 30 071

(51) Int. Cl.⁷ ................................................. G01V 3/00
(52) U.S. Cl. ....................................... 324/307; 324/309
(58) Field of Search ................................ 324/307, 309, 324/311, 315, 322; 600/410

(56) References Cited

U.S. PATENT DOCUMENTS 6,289,232 B1 * 9/2001 Jakob et al. ................ 600/410
6,317,619 B1 * 11/2001 Boernert et al. ............ 600/410
6,545,472 B2 * 4/2003 Prussmann et al. ......... 324/307

OTHER PUBLICATIONS

Klaas P. Pruessmann, Markus Weiger, Markus B. Scheidegger, Peter Boesiger, "Sense: Sensitivity Encoding for Fast MRI", Magnetic Resonance in Medicine; 42:952–962 (1999).

* cited by examiner

Primary Examiner—Edward Lefkowitz
Assistant Examiner—Brij B. Shrivastav
(74) Attorney, Agent, or Firm—Thomas M. Lundin, Esq.

(57) ABSTRACT

The invention relates to an MR method and an MR device for the formation of MR images of an examination zone of an object (10) to be examined. An excitation coil (21) which includes at least one movable and/or flexible excitation coil (19) is used therein for the excitation of the examination zone to be imaged and/or a receiving coil system which includes at least one movable and/or flexible receiving coil (61, 62, 63) is used for the acquisition of MR data from the examination zone. In order to enable the acquisition of MR images with a high accuracy and notably a high spatial and temporal resolution, it is proposed to acquire information concerning the position and orientation of the receiving coils (61, 62, 63) or the at least one excitation coil (19) and to utilize the acquired information for the correction of the input data for the reconstruction or for the correction of the excitation signal of the at least one excitation coil (19). Motions and/or deformations of coils during the acquisition of MR data can thus be taken into account.

12 Claims, 3 Drawing Sheets

US 6,661,227 B2

Figure 1:
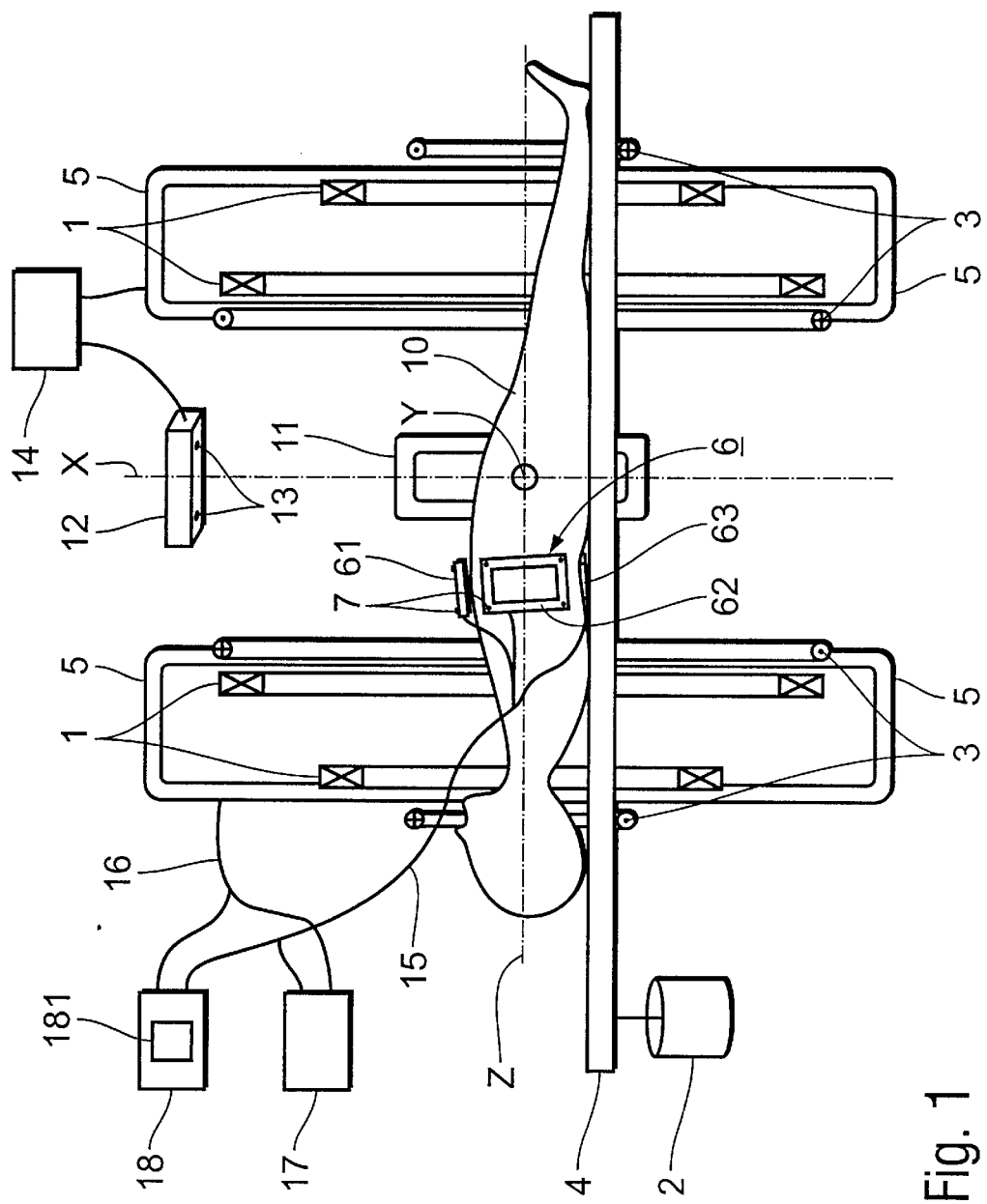

MR METHOD AND MR DEVICE WITH MEANS FOR MAKING CORRECTIONS FOR CHANGES OF THE POSITION AND/OR ORIENTATION OF COILS

BACKGROUND

The invention relates to an MR method for forming MR images of an examination zone of an object to be examined, in which method MR data is acquired from the examination zone by means of a receiving coil system which includes at least one movable and/or flexible receiving coil, and in which the MR images are reconstructed from the MR data acquired. The invention also relates to an MR method of forming MR images of an examination zone of an object to be examined, in which method the examination zone to be imaged is excited by means of an excitation coil system which includes at least one movable and/or flexible excitation coil. The invention also relates to corresponding MR devices provided with a receiving coil system and an excitation coil system and means for the acquisition of information concerning the position and orientation of the coils. Finally, the invention also relates to a computer program for carrying out the MR method and/or for controlling the MR devices.

Magnetic resonance tomography (MR tomography) often utilizes receiving coil systems with a plurality of receiving coils instead of a single receiving coil in order to realize a better signal-to-noise ratio for a given MR sequence and a given acquisition time, and also an enhanced spatial resolution. Suitable reconstruction algorithms are required for this purpose; a number of such algorithms is known. A method which allows for a significant improvement to be achieved is the so-called SENSE method which is known from "SENSE: Sensitivity Encoding for Fast MRI", Pruessmann, K. et al., Magnetic Resonance in Medicine, 42:952–962 (1999). The SENSE method mainly enables a reduction of the measuring time by means of a practical method. Further methods mainly aim to enhance the signal-to-noise ratio.

According to this method either information concerning the sensitivity profiles is used to weight individual contributions (MR data) from each receiving coil to an MR overall image in conformity with the arrangement in space or to differentiate between the contributions from different locations in space to individual acquired MR data. However, such methods are not very robust when the actual coil sensitivity profile deviates from the coil sensitivity profile used in the reconstruction, so that inhomogeneities in intensity and aliasing artefacts occur in reconstructed MR images. Notably the SENSE method is very susceptible in this respect.

When receiving coils which do not remain in a fixed location during the entire data acquisition are used for the acquisition of MR data, the assumption of invariant receiving coil sensitivities is incorrect. Notably movements as well as deformations contribute to changing spatial coil sensitivities. One possibility of counteracting such changes of the receiving coil sensitivities during the data acquisition would be the repeated acquisition of calibration data in the case of suspected significant coil movements; such calibration data enable the current coil sensitivity profile to be determined again. However, this approach would require an additional amount of measuring time and also data processing which, depending on the relevant application, is either not desirable or not possible.

For the excitation of the examination zone by means of an excitation coil system which includes at least one excitation coil it is also implicitly assumed that the profiles of the individual coils are invariant in time.

SUMMARY

Therefore, it is an object of the invention to provide an MR method and an MR device which are capable of forming MR images of improved image quality, that is, even when use is made of movable and/or flexible receiving coils and/or excitation coils, and which notably avoid the described drawbacks.

This object is achieved in accordance with the invention by means of an MR method as disclosed in claim 1 and an MR method as disclosed in claim 5. For the acquisition of MR data it is proposed to acquire position and orientation information of the receiving coils and to correct the input data for the reconstruction on the basis of the position and orientation information acquired so as to compensate for changes in the position and/or orientation of the receiving coils during the acquisition of the MR data prior to the reconstruction of the MR images. For the excitation of the examination zone it is likewise proposed to acquire position and orientation information on the at least one excitation coil and to correct the excitation signal of the at least one excitation coil on the basis of the position and orientation information acquired so as to compensate changes in the position and/or orientation of the at least one excitation coil. The invention is also implemented by means of an MR device as claimed in claim 6 or 7 as well as by means of a computer program as claimed in claim 12.

The invention is based on the recognition of the fact that for a series of applications it is advantageous to acquire information concerning the position and orientation of the coils in the course of the measurement so as to take this information into account directly for the reconstruction of the MR images, that is, instead of carrying out new calibration measurements before, during or after the acquisition of MR data so as to determine the sensitivity profile or excitation profile of coils again, because such a profile may possibly have changed due to motions during or between acquisitions. Suitable means, notably a position measuring device, are then employed to measure motions and/or deformations of coils. A calibration measurement for determining the sensitivity profile of the at least one receiving coil or the excitation profile of the at least one excitation coil, therefore, is required only once prior to the acquisition of the MR data.

In principle calibration measurements could also be dispensed with completely and theoretical models concerning the field distribution of the coils could be used so as to estimate the relevant sensitivity profile on the basis of the knowledge of the position and the orientation of the coils. Later deviations from these profiles can then be corrected on the basis of the information acquired as regards the position and the orientation.

In preferred embodiments it is arranged that as said input data for the reconstruction on the basis of the measured position and orientation information of the receiving coils the sensitivity profiles of the individual receiving coils as well as single images derived from the acquired MR data of the individual receiving coils or the acquired MR data itself can be corrected in accordance with the invention before the reconstruction of an MR overall image.

Analogously, the excitation profile of an excitation coil as derived from a calibration measurement carried out at the beginning can be corrected on the basis of the information concerning the position and orientation of the excitation coil acquired during the data acquisition. In that case the recalculation of the excitation signal for the individual transmitter coils must be performed directly, that is, the sensitivity profile is estimated on the basis of the acquired position and orientation and therefrom the changed excitation signal is calculated and output directly.

For the correction use can be made of, for example, affine or elastic transformations, or a direct calculation of the changed profile or a combination of the two approaches can be used. The invention thus enables MR images to be obtained which have a significantly higher image quality, that is, even in the case of motions or deformations of receiving coils or excitation coils, and artefacts can be avoided to a high degree.

A position measuring device is preferably used for the acquisition of the position and orientation information. This device may in principle have an arbitrary construction; for example, it may be based on an optical, electromagnetic or microcoil principle. For example, a camera can be mounted on a stand for very accurate determination of the position in space of LEDs provided on the coils. For the position measuring device it is essential that the measuring accuracy of the position measurement is as high as possible, that is, preferably of the order of magnitude of a pixel or less. It is also advantageous when the measurement can be performed continuously. However, it is in principle also possible to use the MR device itself, that is, the excitation and receiving coils of the MR device, for the acquisition of position and orientation information of the coils.

A further embodiment of the MR device in accordance with the invention is provided with flexible coils which are capable of entering a state of stiffness when MR data is to be acquired. In principle various constructions are feasible in this respect, for example, as indicated in the claims 10 and 11. It is essential that the coils, that is, excitation coils as well as receiving coils, may remain flexible and movable for as long as no data is acquired. However, when the acquisition of data commences, the coils are made to enter the state of stiffness so that they can no longer move or be bent at all or to a slight degree only. As a result, the MR images ultimately reconstructed can be additionally enhanced. The melting point of the liquid used in the embodiment as disclosed in claim 11 may be chosen to be such that it is liquid at ambient temperature and solidifies at a temperature which is a few degrees below ambient temperature, so that the coils can be made to enter the state of stiffness by cooling the receptacle during the data acquisition, or that the liquid is solid at ambient temperature and becomes liquid at a temperature a few degrees above ambient temperature, so that for the positioning of the coils the coils can be set to the flexible state by heating the receptacle.

In intermediate spaces between the object to be examined and one or more coils of the receiving coil system or the excitation coil system in a further embodiment of the MR device in accordance with the invention there is provided a material which does not produce an MR signal during the acquisition of the MR data but delivers an MR signal only during a calibration measurement for the determination of the coil sensitivity of a receiving coil or for the determination of the excitation field of an excitation coil. The sensitivity profile or the excitation field acquired by means of the calibration measurement can thus be determined with a higher accuracy, because during the calibration measurement no signal loss is incurred in the intermediate space between the examination object and the coil. Thus, the sensitivity profile or the excitation field is also known in this intermediate space after the calibration measurement. On the other hand, the material present in this intermediate space does not make a contribution to the measured MR data, so that ultimately the MR image will not be falsified thereby. The determination of the sensitivity profile in the "environment" of the patient is of interest notably because a subsequent motion may suddenly necessitate estimates for this region in the image reconstruction.

DRAWINGS

Figure 2:
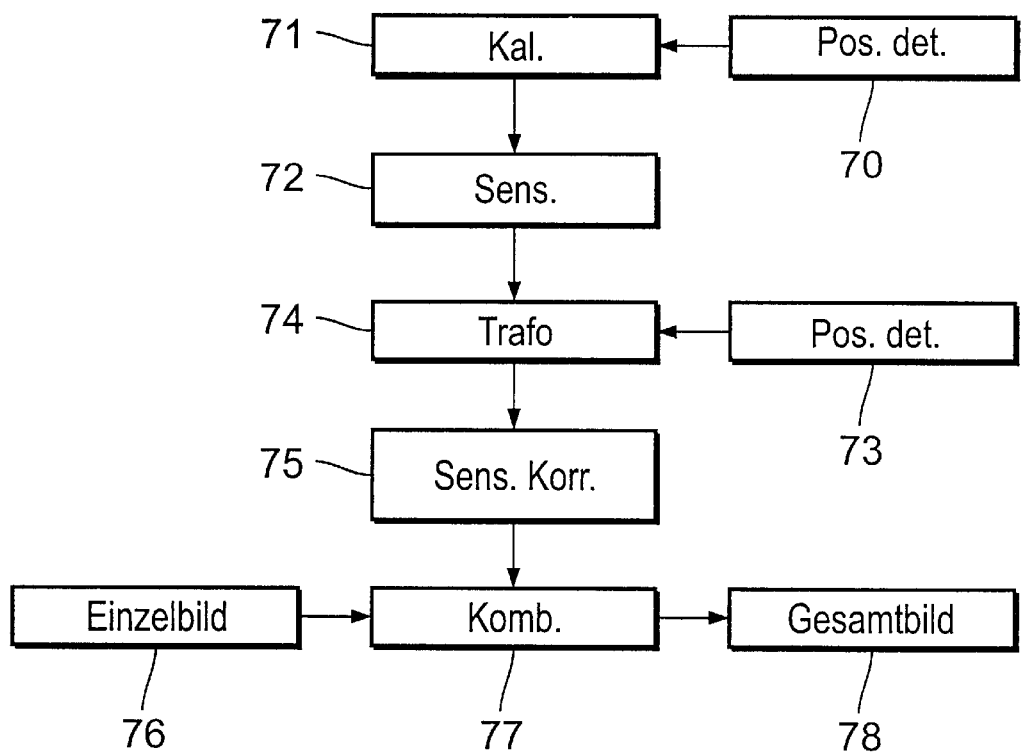
Figure 4:
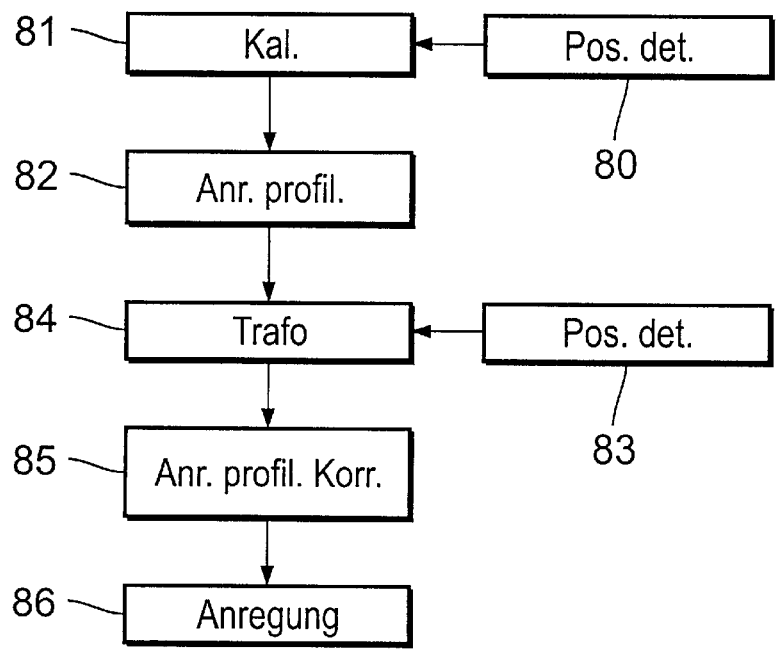
Figure 3:
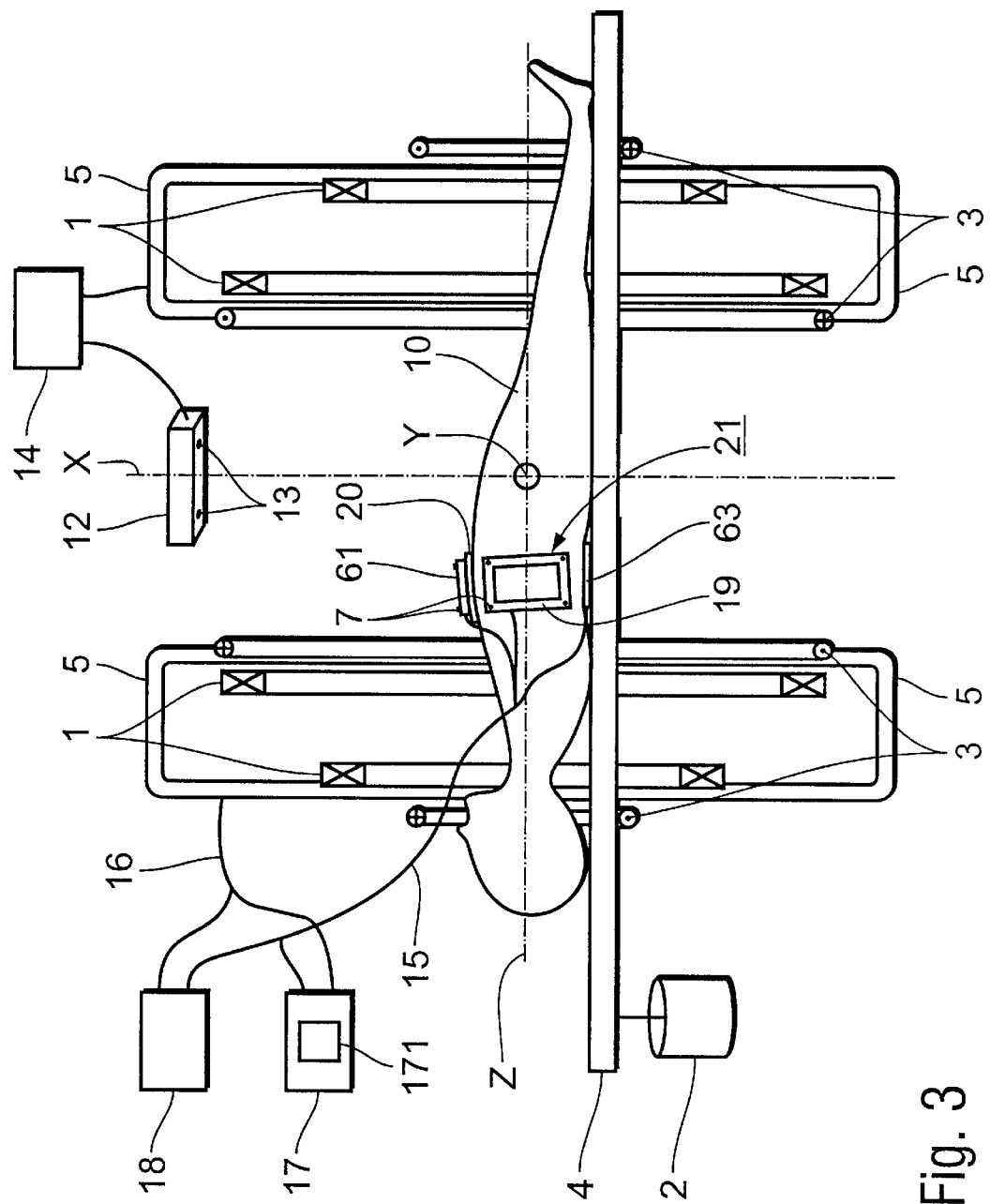

The invention will be described in detail hereinafter with reference to the drawings. Therein:

FIG. 1 shows an MR device in accordance with the invention which includes a receiving coil system, FIG. 2 shows a flowchart of an MR method in accordance with the invention which is to be carried out in an MR device as shown in FIG. 1, FIG. 3 shows an MR device in accordance with the invention which includes an excitation coil system, and FIG. 4 shows a flowchart of an MR method in accordance with the invention which is to be carried out in an MR device as shown in FIG. 3.

DESCRIPTION

FIG. 1 shows a first embodiment of an MR device in accordance with the invention which includes a receiving coil system. The MR device is provided with a main field magnet 1 which generates a steady, essentially uniform magnetic field which has a strength of, for example, 1.5 Tesla and extends in the z direction. The main field magnet 1 is arranged so as to be concentric with the z axis and the patient 10 arranged on a patient table 4. Because the main field magnet 1 is constructed so as to consist of two parts, the central region of the body of the patient 10 can be accessed from the outside.

Also provided are various gradient coil systems 3, 5 which are capable of generating gradient magnetic fields which extend in the z direction and have a gradient in the x direction, the y direction and the z direction, respectively. For the excitation of the examination zone there is provided an excitation coil system which comprises only a single stationary excitation coil 11 in the present embodiment. The coil 11 can also be used as a stationary receiving coil. A motor 2 serves to displace the patient 10 on the patient table 4 in the z direction so as to reach the best position for the examination zone within the steady magnetic field. Further elements which are necessarily included in an MR device, for example, amplifiers for the individual coils, generators, control and display elements, are generally known and, therefore, will not be shown or further elucidated.

A receiving coil system 6, being arranged around the patient 10, that is, around the examination zone which is the thorax at the level of the heart in the present case, serves for the acquisition of the MR signals generated in the examination zone. The MR data acquired is applied, via a connection lead 15, to a control unit 17 and a reconstruction unit 18. Both units 17, 18 are also connected, via a lead 16, to all further coils 1, 3, 5, 11. The control unit 17 controls the MR device, notably the generating of the magnetic fields required for the data acquisition. The reconstruction unit 18 processes the MR data acquired notably by the receiving coil system 6 and forms desired MR images therefrom.

The receiving coil system 6 in the present embodiment includes four receiving coils 61, 62, 63 (a fourth receiving coil is situated opposite the receiving coil 62 and, therefore, is not visible) which are arranged all around the thorax of the patient 10. The receiving coils 61, 62, 63 are constructed so as to be flexible in order to enable optimum adaptation to the body surface of the patient 10. Moreover, the receiving coils 61, 62, 63 are in principle fixed provisionally by means of extensible straps with Velcro, but they are still movable, that is, their position and orientation may change in response to motions of the patient 10 during the data acquisition; for example, they could be shifted, rotated or even bent.

Therefore, in conformity with the invention a position measuring device is provided for the determination of the instantaneous position of the receiving coils 61, 62, 63 during the data acquisition. In the present case the position measuring device includes a camera unit 12 with two cameras 13 which are situated at a distance from one another, for example, CCD cameras which are connected, via an arithmetic unit 14, to the complete system and hence also to the control unit 17 and the reconstruction unit 18. The cameras 13 are constructed and oriented in such a manner that they can receive optical signals which are produced by markers 7, for example, LEDs which operate in the visible range or in the infrared range and are provided especially for this purpose; they are mounted on each of the receiving coils 61, 62, 63. The number and the arrangement of the optical markers 7 are such that the position and orientation of the associated receiving coil can be determined from the individual positions of the markers 7. The cameras 13 are intended notably for the detection of changes in the position and orientation of the receiving coils 61, 62, 63 during the data acquisition. For evaluation the measured position data is applied to a suitable arithmetic unit 14 which first determines the spatial position of the individual optical markers 7 and therefrom the position and orientation of the individual receiving coils 61, 62, 63; on the basis thereof it determines whether changes have occurred in the position and/or orientation as compared with a reference measurement.

Granted, the determination of the position of individual coils, such as the coil 63, may be problematic. On the one hand, however, it is assumed that this coil can move only slightly or cannot move at all. On the other hand, other methods, for example, electromagnetic methods, may also be used to determine the position of such coils.

In as far as changes in position and/or orientation are detected, the input data for the reconstruction can be corrected by means of a correction unit 181 which is included in the reconstruction unit 18. To this end, for example, the respective spatial sensitivity profile, being known from a calibration measurement performed at the beginning, can be corrected, for example, for each receiving coil 61, 62, 63 individually, that is, it can notably be spatially adapted. Alternatively, MR single images formed from the MR data acquired by a respective receiving coil 61, 62, 63 can first be corrected before being combined so as to form an MR overall image. As a further alternative the MR data can also be corrected directly before the reconstruction of the single images and the MR overall image therefrom.

The MR method in accordance with the invention will be described in detail hereinafter with reference to the flowchart of FIG. 2. In a first step 70 the position and orientation of each individual receiving coil 61, 62, 63 are determined for the initial coil configuration. During a first calibration step 71, moreover, a calibration measurement is performed. During this measurement it must be ensured that the position and orientation of the receiving coils do not change. This is possible, for example, by way of a suitable measuring methods with gating or triggering which do not necessitate the coils to be fixed in one way or another for the duration of this measurement. Generally speaking, the measuring time for the calibration measurement amounts to only approximately one minute. The problem of patient motion is then comparatively insignificant.

The spatial sensitivity profile of the individual receiving coils can be determined from the data of the steps 70 and 71 in a next step 72.

During the acquisition of the MR data, the position and orientation of the individual receiving coils can be monitored (step 73), that is, continuously or at regular intervals by means of the position measuring device. When a change of the position or orientation, for example, a shift of a receiving coil or a deformation of a receiving coil, is detected which exceeds a given limit, in the step 74 a corresponding transformation of the sensitivity profile of the relevant receiving coil as determined at the beginning can be determined so as to perform a corresponding correction in the step 75. The sensitivity profile thus corrected is then also used for the reconstruction in the step 77 in which the single images determined (step 76) from the MR data acquired by the individual receiving coils are combined so as to form therefrom a desired MR overall image which is suitable for display (step 78).

It has already been stated that the determination of the position and the orientation during the step 73 can take place continuously during the acquisition of the MR data. Therefore, in principle the respective instantaneous sensitivity profile of the individual receiving coils can be determined for each MR data set, so that the highest degree of precision can be achieved. In this case for each measuring value an independent set of sensitivity profiles is in principle provided for the reconstruction. The reconstruction methods must be modified accordingly so as to take into account the temporal dependency of the individual measuring data on the different sensitivity profiles.

For example, if a significant motion of the coils occurs after half the data acquisition for an image, the reconstruction can advantageously be performed separately for the two partial data sets, that is, with a correspondingly doubled reduction factor. Subsequently, the respective results can be suitably combined.

The described method, however, necessitates a significant amount of calculation work. Preferably, a corrected sensitivity profile is determined for individual receiving coils only if the movement or deformation of a receiving coil has exceeded a given level. However, this also enables a significant enhancement of the image quality as well as a higher spatial and temporal resolution of MR images.

FIG. 3 shows a further embodiment of an MR device in accordance with the invention which includes an excitation coil system 21. FIG. 4 shows the associated flowchart. The excitation coil system 21 comprises an excitation coil 19 which can at the same time act also as a receiving coil. As a receiving coil it thus constitutes, in conjunction with further receiving coils 61 and 63 as well as a fourth receiving coil which is not visible, the receiving coil system already shown in FIG. 1. The excitation coil 19 is also connected to the control unit 17 and the reconstruction unit 18. All further elements of the MR device are provided in so as to be similar or identical to those in the MR device shown in FIG. 1. Merely the excitation coil 11 shown therein can now be dispensed with.

Because of the reciprocity, for each coil the sensitivity profile is identical to the resultant excitation profile when it is used to generate a magnetic field. In order to achieve a specific excitation of the examination zone, therefore, it is necessary to know the excitation field generated by the excitation signal as well as possible. For example, for a coil this field can be calculated when the sensitivity profile of the coil is known. This also demonstrates that a change of the position and orientation of a coil also leads to a change of the excitation field of the coil, so that the excitation by means of an excitation signal, taking place several times during an MR data acquisition, must be adapted in the case of a change of the position and orientation of the excitation coil during the acquisition.

This is illustrated in the flowchart of FIG. 4. First the initial excitation profile of the excitation coil is determined (step 82) from the initial position and calibration measurements (steps 80 and 81). During the acquisition, the position and the orientation of the excitation coil can then be detected by means of the same position measuring device (step 83) when the excitation coil is also provided with the markers 7 for the position measuring device. When a change of position and/or orientation of the excitation coil is detected on the basis of this measurement, a transformation rule can be determined in the step 84 in order to correct the excitation profile of the excitation coil subsequently in the step 85. Thus, this correction can be performed continuously during the acquisition so that the examination zone is always excited with the optimum and desired excitation field (step 86). To this end, suitable correction means 171 are included in the control unit 17 for the correction of the excitation signal.

Ultimately, this method ensures that, because of the increased correspondence between desired excitation and actual excitation, MR images can be formed with a higher accuracy and notably with a higher temporal and spatial resolution.

Any measuring device in which the position and orientation of the coils can be determined as accurately as possible and with an as small as possible effort is in principle suitable for use as the position measuring device. Some possibilities will be described in detail hereinafter by way of example:

a) As is shown in the FIGS. 1 and 3, use can be made of an optical position measuring device in which the optical signals emitted by suitable markers, for example, LEDs, can be evaluated by means of cameras. Because it is assumed that the coils situated underneath the patient move or change only to a limited extent during the acquisition, such optical markers can also be dispensed with at that area. In this case no additional measuring time is required for the acquisition of further MR data.

b) Alternatively, use can be made of electromagnetic markers which can be localized by means of a suitable measuring device. No additional MR measuring time is then required either.

c) The coils may also be provided with active or passive microcoils which are also capable of picking up an MR signal from the examination zone or of emitting themselves an MR signal which can be detected by the receiving coils, so that ultimately the position of the microcoils and hence of the receiving or excitation coils can be determined therefrom. However, this would require an additional measuring time, that is, in dependence on the MR sequence used.

d) In principle, however, as stated before the MR device itself can also be used for the determination of the position and orientation information.

For position detection flexible coil elements, which can be deformed to a stronger degree, require more than three points of the coil element so as to describe the deformation accordingly. The position determination and the corresponding adaptation of the sensitivity profile in the case of a receiving coil, therefore, are rather complex. Therefore, it may be advantageous to limit the flexibility of such coils mechanically during the acquisition by taking steps for such coils so as to enable switching over between a flexible state and a state of stiffness. Such coils can then be switched to the flexible state in order to position the coils while achieving optimum adaptation to the body surface. For the data acquisition, however, they are switched to the state of stiffness so that deformation is no longer possible and the position determination on the basis of three points on the coils suffices to enable detection of any motion.

Various constructions are feasible for such coils. For example, such a coil can be manufactured by providing the coil with an airtight receptacle which is filled, for example, with small spheres of Styropor. For as long as the receptacle is subject to the normal ambient pressure, the coil is flexible. However, as soon as the receptacle is evacuated, the spheres are pressed together so that the receptacle enters a state of stiffness. This technique is known, for example, from the practice of an ambulance in which it is used to immobilize a patient on the stretcher during transport.

As a second possibility such coils can be realized by providing the coils with a receptacle which is filled with a material having a melting point approximately equal to the ambient temperature. When the material is heated a few degrees, the coil can be made flexible in that the material is liquefied; when the material is cooled again, it solidifies so that the coil becomes rigid again.

There may be cases where an initial determination of the excitation or sensitivity profile of a coil is not possible for all locations because, for example, during the calibration measurement no MR signal can be measured in given regions within or outside the patient. The transformation of the excitation profile or the sensitivity profile in order to take into account changes in position and orientation, therefore, often requires extrapolations. Extrapolations of this kind can be carried out on the basis of various principles, for example, by means of local or global adaptations to analytic functions such as polynomials or to theoretically known sensitivity profile distributions of coils. Alternatively, however, it is also possible to fill an intermediate space, if any, between a coil and a patient with a material 20 as shown in FIG. 3. This material should be such that it produces an MR signal during a calibration measurement but no signal or only a small signal during the actual MR data acquisition. To this end, preferably materials having a very short $T_2$ or $T_2^*$, for example, high concentration salt solution or polymers, are used in combination with MR sequences with very short echo times, for example, TE<0.3 ms, for the calibration measurement. In such MR sequences materials of this kind are visible whereas in MR sequences with normal echo times, as used for the acquisition of the MR data during the imaging, they remain invisible.

The invention can be used even further so as to a major extent so as to correct the motion also during the acquisition of a single MR data set with an even higher temporal resolution. In the simplest case each set of k space data acquired in the absence of significant coil motion is separately reconstructed. The resultant sub-images are then combined while utilizing the correspondingly valid sensitivity profiles. In more difficult cases the sensitivity profiles in the encoding matrix vary as a function of time and, therefore, are dependent not only on the position in space but also on the position in the frequency domain. A general formalism, for example, as proposed in conjunction with non-cartesian acquisitions while utilizing the SENSE method, must then be used for the reconstruction.

A correction of the sensitivity profile or the excitation profile can in principle be carried out by way of a simple co-ordinate transformation when only a motion or rotation of a coil has taken place. In the case of a deformation of a coil, however, the correction is significantly more difficult. In that case, for example, the field profile of the coil could be calculated again, possibly while utilizing knowledge regarding the tissue sensitivity or by comparison with the profile initially found during the calibration measurement. Alternatively, models for a transformation could then also be used.

Finally, the method in accordance with the invention, notably the position information and orientation information determined, can also be utilized to determine the mutual coupling or noise correlation of two neighboring coils. This knowledge can then be used to realize an improved virtual decoupling of the coils so that ultimately MR images of enhanced image quality are obtained once more.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. An MR method for forming MR images of an examination zone of an object to be examined, in which method MR data is acquired from the examination zone by means of a receiving coil system which includes at least one movable and/or flexible receiving coil, and in which the MR images are reconstructed from the MR data acquired, wherein information concerning the position and orientation of the at least one receiving coil is acquired during the acquisition of the MR data and that input data for the reconstruction is corrected on the basis of the acquired information concerning the position and orientation in order to compensate changes in the position and/or orientation of the at least one receiving coil during the acquisition of the MR data prior to the reconstruction of the MR images.

2. An MR method as claimed in claim 1, wherein the sensitivity profile of the at least one receiving coil is corrected on the basis of the information concerning the position and orientation.

3. An MR method as claimed in claim 1, wherein single images derived from the MR data acquired by the at least one receiving coil are corrected on the basis of the information concerning position and orientation prior to combination of the single images so as to form an MR overall image.

4. An MR method as claimed in claim 1, wherein the MR data acquired by the at least one receiving coil is corrected on the basis of the information concerning position and orientation.

5. An MR device for forming MR images of an examination zone of an object to be examined, which device includes a receiving coil system which includes at least one movable and/or flexible receiving coil for the acquisition of MR data from the examination zone, and also includes a reconstruction unit for the reconstruction of MR images from the acquired MR data and means for the acquisition of information concerning the position and orientation of the at least one receiving coil, wherein the reconstruction unit includes means for the correction of input data for the reconstruction on the basis of the acquired information concerning the position and orientation of the at least one receiving coil prior to the reconstruction of the MR images in order to compensate changes in the position and/or orientation of the at least one receiving coil during the acquisition of the MR data.

6. An MR device as claimed in claim 5, wherein a position measuring device, notably an optical or an electromagnetic position measuring device or a position measuring device based on microcoils, is provided for the acquisition of the information concerning the position and orientation.

7. An MR device as claimed in claim 5, wherein the receiving coil system or the excitation coil system includes flexible coils which are capable of entering a state of stiffness, and that the coils can be adjusted to the state of stiffness for the acquisition of the MR data.

8. An MR device as claimed in claim 7, wherein each of the coils of the receiving coil system and/or the excitation coil system is provided with an airtight receptacle in which a filler material is provided in such a manner that the coils are flexible in the normal state whereas during the acquisition of the MR data they are rendered stiff by at least partial evacuation of the receptacle.

9. An MR device as claimed in claim 7, wherein the coils of the receiving coil system and/or the excitation coil system are provided with a respective receptacle which is filled with a liquid which has a suitable melting point such that slight heating or cooling enables a transition from a liquid to a solid state.

10. An MR device as claimed in claim 5, wherein a material which does not produce an MR signal during the acquisition of the MR data but yields an MR signal only during a calibration measurement for determining the coil sensitivity of a receiving coil or the excitation field of an excitation coil is provided in intermediate spaces between the object to be examined and one or more coils of the receiving coil system and/or the excitation coil system.

11. An MR method for forming MR images of an examination zone of an object to be examined, in which method the examination zone to be imaged is excited by means of an excitation coil system which includes at least one movable and/or flexible excitation coil, wherein information concerning the position and orientation of the at least one excitation coil is acquired during the excitation of the examination zone and that the excitation signal of the at least one excitation coil is corrected on the basis of the acquired information concerning position and orientation in order to compensate changes in the position and/or orientation of the at least one excitation coil during the excitation.

12. An MR device for forming MR images of an examination zone of an object to be examined, which device includes an excitation coil system which includes at least one excitation coil for the excitation of the examination zone to be imaged, and also includes a control unit for controlling the excitation coil system and means for the acquisition of information concerning the position and orientation of the at least one excitation coil during the excitation of the examination zone, wherein the control unit includes means for the correction of the excitation signal of the at least one excitation coil in order to compensate changes in the position and/or orientation of the at least one excitation coil during the excitation.

* * * * *